United States Patent [19]
Lawson et al.

[11] Patent Number: 5,912,804
[45] Date of Patent: Jun. 15, 1999

[54] DIODE HOLDER WITH SPRING CLAMPED HEAT SINK

[75] Inventors: Randall Lee Lawson, Hoopeston; Gary Patrick Schlosser, Danville, both of Ill.

[73] Assignee: Schumacher Electric Corporation, Mount Prospect, Ill.

[21] Appl. No.: 09/075,058

[22] Filed: May 8, 1998

[51] Int. Cl.[6] ...................................................... H05K 7/20
[52] U.S. Cl. ........................... 361/704; 361/690; 361/707; 361/714; 257/718; 257/719; 257/726; 257/727; 165/80.2; 165/80.3; 439/68; 439/70; 439/73; 439/264
[58] Field of Search ..................................... 361/690, 704, 361/707, 709, 712, 717, 718, 787; 257/717–719, 727; 165/80.3; 439/68–73, 268, 264, 265

[56] References Cited

U.S. PATENT DOCUMENTS

| 3,916,435 | 10/1975 | Camplin et al. | 257/785 |
| 5,384,940 | 1/1995 | Soule et al. | 361/719 |
| 5,483,103 | 1/1996 | Blickhan et al. | 257/718 |
| 5,500,556 | 3/1996 | Kosugi et al. | 257/718 |

*Primary Examiner*—Leo P. Picard
*Assistant Examiner*—Boris L. Chervinsky
*Attorney, Agent, or Firm*—Richard A. Zachar

[57] ABSTRACT

A diode holder with spring clamped heat sink includes a unitary holder having spaced apart pockets for the diodes, a heat sink plate, a compression coil spring and connector such as a rivet for clamping the holder and plate with the diodes engaging the plate with the clamping force being applied through the spring.

8 Claims, 3 Drawing Sheets

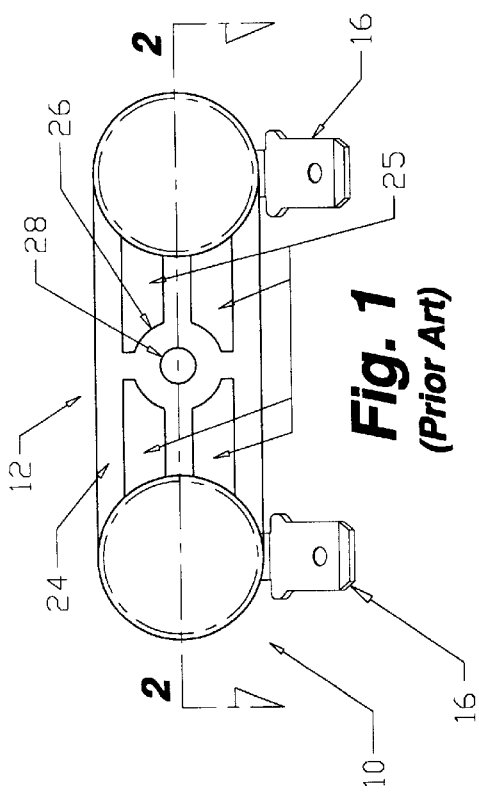
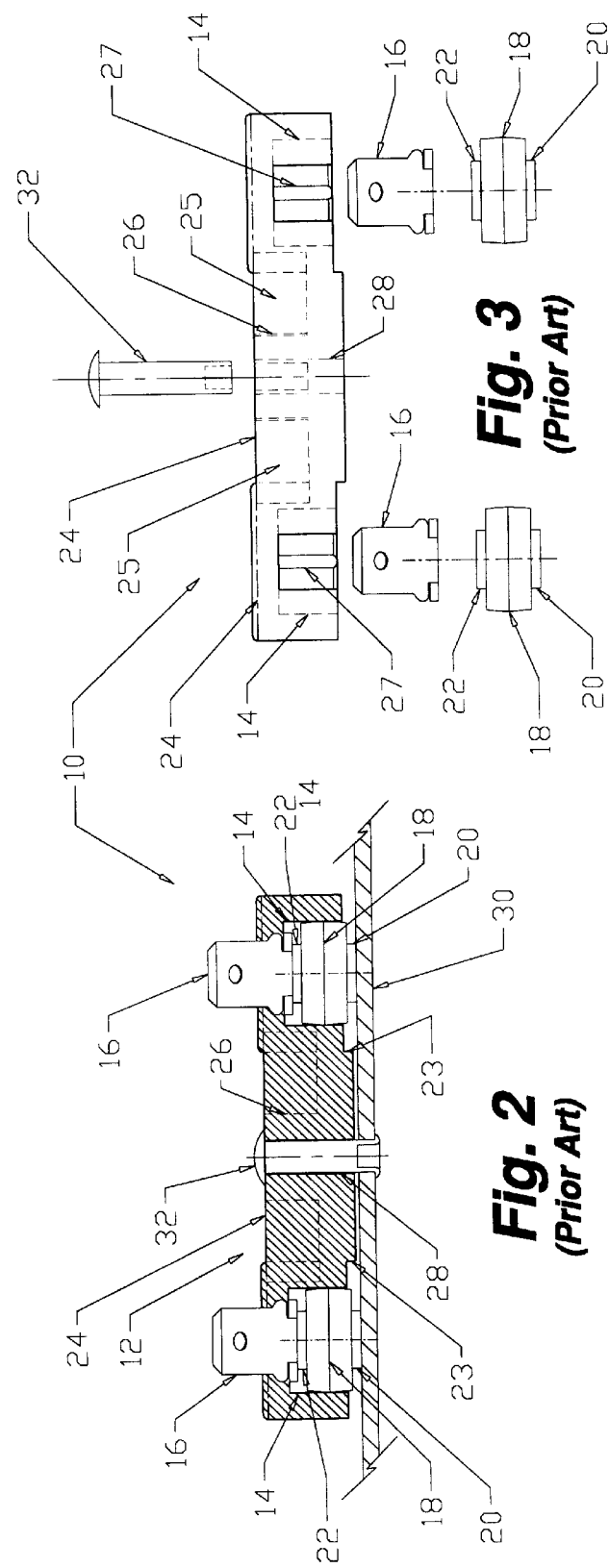
*Fig. 1 (Prior Art)*
*Fig. 2 (Prior Art)*
*Fig. 3 (Prior Art)*

DIODE HOLDER WITH SPRING CLAMPED HEAT SINK

The present invention relates to rectifier assemblies of the type used in automotive battery chargers and the like for converting AC to DC and, more particularly, to such assemblies of the button diode type.

Typically, rectifier diodes of the so-called button diode type are employed in automotive and other vehicle battery chargers. It is standard practice to seat a pair of such diodes in pockets of a diode holder (or housing) with the cathodes of the diodes exposed and the anodes engaging brass tab terminals connected to an AC source. The diode holder is conventionally riveted to a conductive plate (referred to as a heatsink plate) with the diode cathodes pressed in firm contact therewith. The plate conducts the DC output of the diodes as desired, for example, to the bolt of a circuit beaker.

A button rectifier diode is basically a semiconductor chip bonded between two nickel-plated copper heat sinks with an encapsulating material of thermal-setting silicone. Button rectifiers commonly employed in automotive battery chargers include 50 amp rectifier diodes, such as type AR 5002 from Electronics Industry (USA) Co. (d/b/a EIC Semiconductor) and SR 4355 from Motorola, Inc. (Semiconductor Products Division).

The diode holder generally comprises an elongated block of high temperature plastic, such as Rynite FR530180, that is provided with a diode receiving pocket at each of its opposed ends. The pocket walls are provided with radially spaced ribs so that a tight friction fit is established between the pockets and diodes. The brass tab terminals are placed into the diode pockets and, thereafter, the diodes are inserted with the diode anodes in contact with the terminals and the diode cathodes exposed exteriorly of the diode holder pockets. When the diode holder is mounted to the plate, the diode cathodes engage the plate and maintain an air gap between the holder and the plate to prevent heat transfer therebetween.

The holder is provided with a central bore midway between the diode pockets. With the diodes in the pockets, the holder is mounted to the heatsink plate by aligning the bore with mounting hole provided in the plate, and inserting the shank of a machine rivet through the bore and plate opening.

To properly secure the holder to the plate, the rivet machine is set to a specific clinch height (i.e. distance from the machine rivet head to the roll). Rivet machine set-up involves establishment of a reference distance "set" for the rivet clinch. To do so, a sample rectifier assembly is riveted. That assembled part is then checked for good tension between the brass tabs and the diodes (cannot be loose) and an electrical test is performed to see if the compression force applied by the plate against the diodes has damaged either of the diodes. The rivet machine is then adjusted accordingly and the above procedure repeated until both checked items are satisfactory. A feeler gauge is then used to measure the air gap between the housing and heatsink plate. That distance serves as a quick check by the rivet machine operator.

Although the foregoing rectifier assembly and method of production have been commonly employed to provide half wave rectification of AC in chargers, the industry has experienced relatively high rates of diode failure. It has also experienced charger failures due to deflection of the diode cathodes out of good electrical and thermal contact with the plate due to heat-produced deformation of the diode holder. To overcome these problems it has been proposed to adopt alternative means to mount the diodes, for example: (1) direct soldering of the diode to the tab and heatsink; (2) use of larger stud mount diodes; and (3) using larger press fit diodes and an extruded heatsink. However, these alternative methods have proven to be much more expensive compared to the standard assembly.

Applicants recognized that with standard assemblies excessive compression forces are sometimes applied to the diodes when the diode holder is riveted to the plate. The diodes noted above are typically rated to withstand 32 pounds of compression force, which is significantly greater than the designed force to be applied to them when the diode holder is riveted to the plate. However, applicants found that, due to non-parallelism of the diode anode and cathode surfaces, excess tolerance build-up, improper set-up of the rivet machine, set-up drifting, or a combination of these factors, compression forces at times are being applied to the diodes in excess of the diode compression limit.

With regard to tolerance build-up, it should be appreciated that the button diodes themselves are dimensionally variable. For example, Motorola's specifications for its SR 4355 rectifier diode call for a minimum separation between the anode and cathode contact surfaces of 0.234 inch and a maximum separation of 0.246 inch. The corresponding dimensional separation called for by the EIC specifications for its AR 5002 rectifier diode are 0.235 and 0.250, respectively. The wall thicknesses of the diode holder, nominally 0.100 inch, are also subject to slight variation (±0.003 inch tolerance) as is the thickness of the brass tab for electrically connecting the rectifier diode to AC.

Rectifier diodes generate heat. Most of this heat is transferred to the heatsink plate via the contact between the diode cathodes and the plate. An insulating air gap between the plate and diode holder minimizes heat transfer therebetween. However, some heat is transferred and additional heat is transferred to the holder from the diodes. Although, as previously noted, the holder is typically formed of a high heat plastic, such as duPont's RYNITE thermoplastic polyester plastic FR530180, the diode holder structure does slightly deform under high heat conditions. If by reason of tolerance build-up and/or failure of the riveting machine to affix the rivet so as to cause the diode cathodes to bear against the plate with sufficient force, the result can be poor electrical contact between the cathodes and plate as well as loss in heat dissipation which can destroy the diode.

Applicants have further recognized that the tight frictional fit between the diodes and diode pockets, when coupled with non-parallel diode anode/cathode contact surfaces, leads to poor electrical and thermal conductivity as between the plate and diode cathodes and/or as between the diode anodes and the brass tab terminals under certain conditions.

SUMMARY OF THE INVENTION

Applicants discovered that the foregoing and other problems stemming from rivet machine impact shock, tolerance build-up, improper rivet machine set up or drifting can largely be eliminated by riveting the diode holder to the plate through a compression spring having a desired load rating (for example, 12 pounds) when deflected a predetermined amount to a point less than its solid height. Further, applicants found that it is preferable to permit the diodes to float within the diode pockets. Such tends to reduce adverse effects of non-parallelism of the diode contacts and heat deformation of the holder.

The features of the present invention are discussed in more detail below, and it is not intended that the summary presented hereinabove should in any way limit the nature or scope of the invention disclosed and claimed herein.

DESCRIPTION OF THE DRAWINGS

The invention if further described with reference to the accompanying drawings, where like numbers refer to like parts in several views.

FIG. 1 is a plan view of a prior art rectifier assembly;

FIG. 2 is a sectional view taken, as indicated, along the line 2—2 of FIG. 1;

FIG. 3 is an exploded side view of the assembly of FIGS. 1 and 2;

Figure 4:
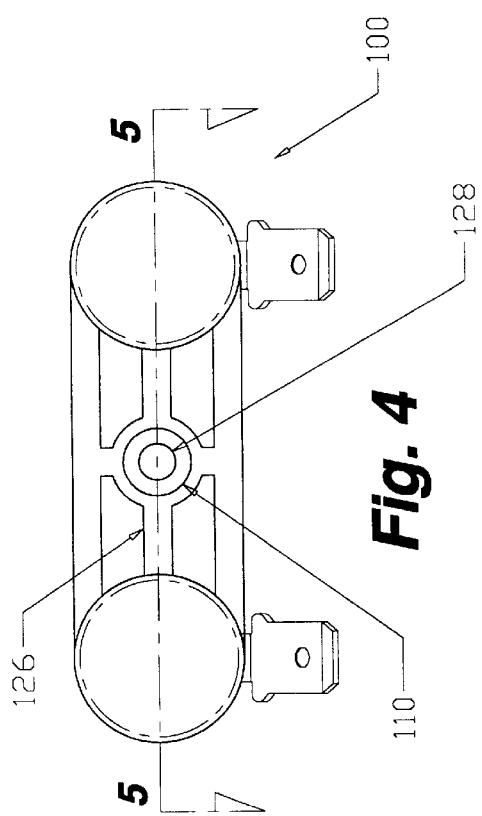
FIG. 4 is a plan view of the rectifier assembly of FIGS. 1–3 modified in accordance with our invention.

These drawing figures are provided for illustrative purposes only and are not drawn to scale, nor should they be construed to limit the intended scope and purpose of the present invention.

DETAILED DESCRIPTION

For purposes of illustrative disclosure, the invention will be described with reference to a standard 50 amp rectifier assembly used by Schumacher Electric Corporation in its line of battery chargers. Such a prior art assembly 10 is shown in FIGS. 1–3 comprising an elongated diode holder 12 providing a pair of diode pockets 14 that are spaced apart 1.400 inch center-to-center. Brass tabs 16 formed of 0.032 inch thick plate are inserted into the pockets 14. Rectifier diodes 18 are then frictionally fit into the pockets 14 with their cathodes 20 exposed and their anodes 22 in contact with tabs 16. The holder 12 has a bottom surface 23 and top surface 24. The top surface has evacuated areas 25 forming a central column 26. As best shown in FIG. 2, bottom surface 23 has an offset 23' of 0.035 inch. To provide a tight frictional fit, the pockets 14 each have a plurality of radically spaced ribs 27. A central bore hole 28 having a 0.130 inch diameter and 0.335 inch length is formed centrally between the pockets 14. The holder 12 with the tabs 16 and diodes 18 seated within pockets 14 is riveted to a heatsink plate 30 of aluminum, steel or other thermally and electrically conductive material so that the diode cathodes 20 make good electrical contact therewith. It will be noted that the cathodes 20 extend outwardly of the holder 12 so that an air gap is maintained between the holder 12 and plate 30. A machine rivet 32 is fitted into bore hole 28 and a corresponding hole in plate 30 to secure the holder 12 to the plate 30.

The depth of each of the pockets 14 is 0.220 inch. The interior pocket walls are formed with a 0.20 inch radius to accommodate the above-noted diodes whose diameters run from 0.395 inch to 0.405 inch in the case of Motorola's SR4355. The pockets have three ribs 27 (only one shown) which are radially spaced 120°, each rib projecting inwardly a distance of 0.060 inch to provide a firm frictional fit between the diode and pocket.

Figure 6:
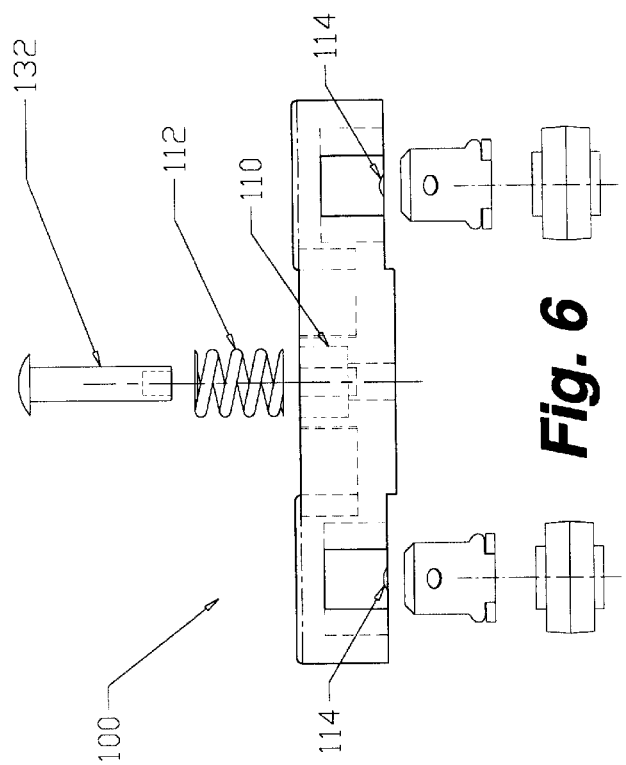
FIG. 6 is an exploded side view of the assembly of FIGS. 4 and 5.
Figure 5:
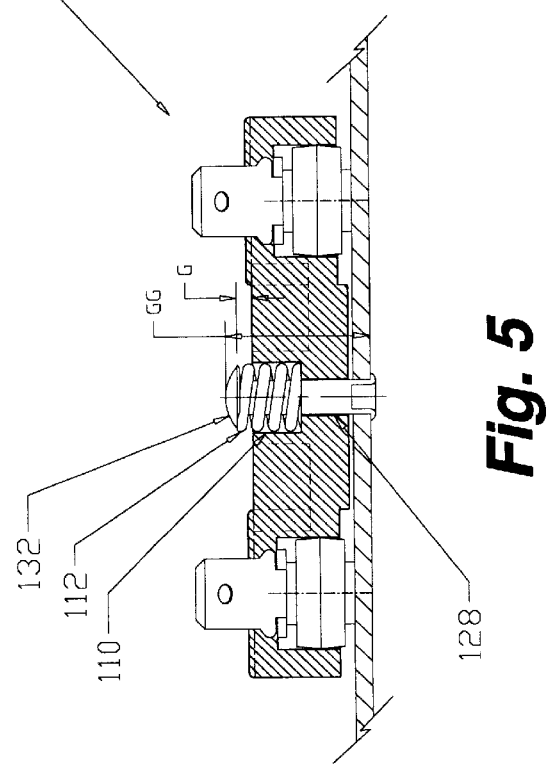
FIG. 5 is a sectional view taken, as indicated, along the line 5—5 of FIG. 4.
Figure 7:
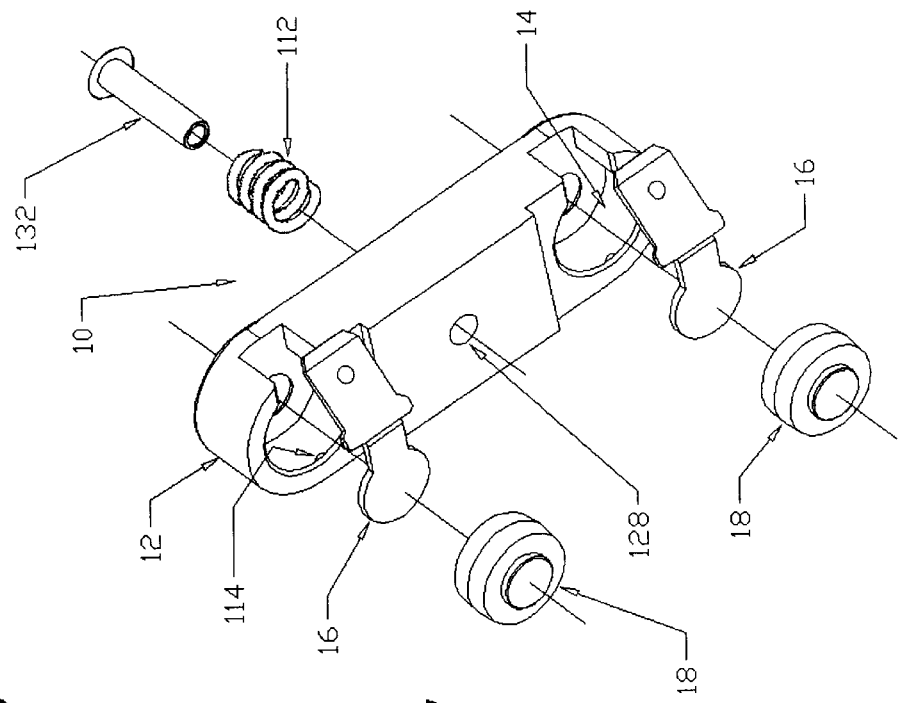
FIG. 7 is a bottom exploded perspective view of the assembly of FIGS. 4–6.
Figure 8:
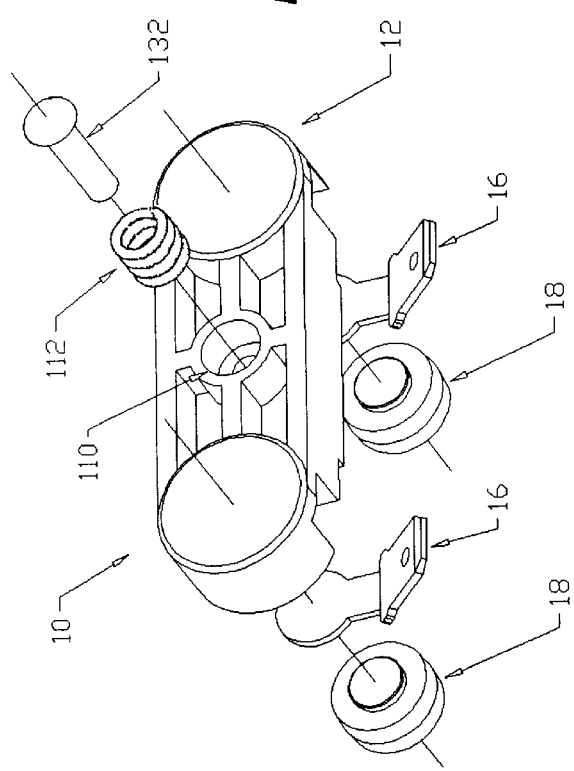
FIG. 8 is a top exploded perspective view of the assembly of FIGS. 4–6.

A modified assembly 100 in accordance with the present invention is shown in FIGS. 4–8. The assembly 100 is identical to the assembly 10 except as hereafter described.

A C-bore pocket 110 having a 0.250 inch diameter and a 0.170 inch depth is formed in alignment with the rivet hole 128. Pocket 110 receives a compression coil spring 112 having a free length of 0.313 inch, a spring rate of 128.6 lbs./inch, a solid height of 0.214 inch, an outside diameter of 0.240 inch, a wire diameter of 0.040 inch and a load rating at solid height of approximately 14 lbs. Suitable springs may be obtained from Lee Engineering, stock number LC-040C-1S. The foregoing data are for a spring formed of stainless steel.

The machine rivet 132 employed for securing the holder to the plate comprises a type 1006/1008 machine rivet from American Rivet Company, made of steel with zinc plating, 0.50 long with a 0.220 inch diameter head and a 0.120 inch outer diameter shank.

The rivet machine may be set to clinch the machine rivet 132 to connect the holder to the plate of a sample part together leaving a 0.060 inch gap G between the rivet head and the top surface of the diode holder. Alternatively, it may be set to establish a gap GG of 0.480 inch between the top of the rivet head to the bottom of the plate. This gap serves as a reference dimension for ascertaining that the proper spring loaded height has been achieved. Precision adjustments thereafter are not required because of the compression spring's compensation. With a rivet machine set-up as described, the compression spring 112 is deflected approximately 0.077 inch to produce a compression force of approximately 12 lbs. on the diode cathodes which is well below the destructive limit of the diodes.

The spring 112 at the established rivet machine set has sufficient remaining compression deflection ability prior to reaching its solid height as to accommodate tolerance build-up of the various parts as well as thermal deformation thereof.

It will be noted that the ribs 27 of the holder pockets 14 of the prior art assembly of FIGS. 1–3 are removed from the diode pockets of the modified assembly 100. It has been found that doing so permits the diodes to float to some degree within the pockets to provide better contact between the plate, diodes and brass terminals in the event of (a) non-parallelism of the diode anode/cathode contact surfaces, and/or (b) deformation of the holder due to heat. In place of such ribs, the modified holder includes radially spaced nubs 114 at the entrance to the diode pockets (see FIG. 6) to prevent the diodes from falling out of the pockets after having been placed therein.

In addition to the advantages discussed above, the assembly of the present invention reduces direct shock impact to the diodes from the rivet assembly machine, dampens forces transferred to the diodes during the operations required to attach the mating wire assemblies to the brass tabs, and permits the diodes to self align.

In view of the foregoing, it will be appreciated that applicants' solution to the problems encountered by the industry involves use of a resilient member to (a) accommodate dimensional variations of the parts comprising the assembly, (b) accommodate deformations caused by heat, and (c) cushion against excessive shock forces during assembly operations. In the illustrated embodiment, the resilient member is a compression spring but other like resilient members could be employed. Although the invention has been described with reference to an assembly wherein the diode holder is mounted by a machine rivet to the heatsink plate, it will be appreciated that such any connector having a shank and head, such as a screw or bolt, could equally be used. The spring or other compression member could be located at the side of the plate opposite the holder, the important consideration being that the clamping force applied by the connector (i.e. rivet, screw, bolt, etc.) be transmitted through the compression member. Thus, while the present invention has been described with reference to the presently preferred embodiment, workers skilled in the art will recognize that changes may be made in form and detail without departing from the spirit and scope of the invention.

What is claimed is:

1. In an assembly for securing rectifier button diodes to a heatsink plate wherein a pair of diodes are disposed in spaced apart pockets of a unitary diode holder and said holder is clamped to said plate by a connector having an axially elongated portion which extends through a passage in the holder located between said pockets to press said diodes into firm engagement with said plate, said diodes having a destructive limit in compression, the improvement wherein said assembly further includes a compression coil spring disposed coaxially of said elongated portion and having a first end and a second end, said first end bearing against said holder, said connector including means compressively engaging said second end, said spring being compressed to less than its solid height.

2. In an assembly in accordance with claim 1 wherein said spring has a load rating at said solid height less than said destructive limit.

3. In an assembly in accordance with claim 1 wherein said connector comprises a machine rivet having a shank extending through said spring.

4. In an assembly in accordance with claim 3 wherein said rivet includes a head in compressive engagement with said second end.

5. In an assembly in accordance with claim 4 wherein said passage includes a bore pocket, said spring being received in said bore pocket.

6. A rectifier assembly comprising a unitary diode holder having a pair of spaced apart pockets, a pair of rectifier diodes each disposed in a separate one of said pockets, a heatsink plate, a compression member, and a machine rivet compressively clamping the holder and plate together with the diodes bearing against the plate with the compressive clamping force being applied through said compression member.

7. A rectifier assembly in accordance with claim 6 wherein said compression member comprises a compression coil spring.

8. A rectifier assembly in accordance with claim 7 wherein said diodes have a destructive limit in compression, wherein said spring has a load rating at solid height less than said destructive limit, and wherein said spring is compressed to a height greater than said solid height.

* * * * *